United States Patent
Clinton et al.

[11] Patent Number: 5,969,997
[45] Date of Patent: Oct. 19, 1999

[54] NARROW DATA WIDTH DRAM WITH LOW LATENCY PAGE-HIT OPERATIONS

[75] Inventors: Michael P. Clinton, Essex Junction; Marc R. Faucher, South Burlington; Erik L. Hedberg; Mark W. Kellogg, both of Essex Junction; Wilbur D. Pricer, Charlotte, all of Vt.

[73] Assignee: International Business Machines Corporation, Armonk, N.Y.

[21] Appl. No.: 08/942,825

[22] Filed: Oct. 2, 1997

[51] Int. Cl.[6] .................................................. G11C 15/00
[52] U.S. Cl. ............................ 365/189.02; 365/189.05; 365/230.02; 365/189.03; 365/189.01
[58] Field of Search .......................... 365/189.01, 189.02, 365/230.03, 230.02; 395/425, 325

[56] References Cited

U.S. PATENT DOCUMENTS

| | | | |
|---|---|---|---|
| 5,283,880 | 2/1994 | Marcias-Garza | 395/425 |
| 5,289,584 | 2/1994 | Thome et al. | 395/325 |
| 5,737,563 | 4/1998 | Shigeeda | 395/405 |
| 5,793,663 | 8/1998 | Ng et al. | 365/49 |
| 5,805,854 | 9/1998 | Shigeeda | 395/401 |

*Primary Examiner*—Viet Q. Nguyen
*Attorney, Agent, or Firm*—Whitham, Curtis & Whitham; Robert A. Walsh

[57] ABSTRACT

A high speed Random Access Memory (RAM) array device includes several logical banks, each of which can be uniquely addressed. Each of these logical banks contains a unique memory array segment and associated page register, the latter serving as a temporary storage location during high-speed page hit operations. To reduce latency during an initial page hit, further array optimization is realized by segmenting each logical bank into two segments with one, smaller segment, comprising a faster random access memory (FRAM) for storing initial data in a data stream. A high speed page register connects the FRAM directly to a multiplexer/demultiplexer connected to the device I/O ports bypassing an internal bus protocol such that the initial data can be transferred between the FRAM and the I/O ports faster thereby improving page-hit latency. Hence, segmenting the logical banks to include only a small high speed segment results in a performance gain approaching what could be achieved by implementing the entire memory device with a high speed FRAM, but at much lower cost.

17 Claims, 2 Drawing Sheets

NARROW DATA WIDTH DRAM WITH LOW LATENCY PAGE-HIT OPERATIONS

BACKGROUND OF THE INVENTION

1. Field of the Invention

The present invention generally relates to high bandwidth/performance Dynamic Random Access Memories (DRAMs) and, more particularly, to high bandwidth/performance DRAMs with improved, lower page-hit latency.

2. Description of the Related Art

Dynamic random access memory (DRAM) performance is a well known limitation to computer system performance. Processor speeds are rapidly outpacing main memory performance, with both processor designers and system manufacturers developing higher performance memory subsystems in an effort to minimize performance limitations due to the slower DRAM devices. Ideally, the memory performance would match or exceed processor performance, i.e., a memory cycle time would be less than one processor clock cycle. This is almost never the case and, so, the memory is a system bottleneck. For example, a state of the art high speed microprocessor may be based on a 200 MegaHertz (MHZ) clock with a 5 nanosecond (ns) clock period. A high performance DRAM may have a 60 ns access time, which falls far short of processor performance.

This system bottleneck is exacerbated by the rise in popularity of multimedia applications. Multimedia applications demand several times more bandwidth for main memory or frame-buffer memory than computational intensive tasks such as spread sheet analysis programs or, other input/output (I/O) intensive applications such as word processing or printing.

Extended Data Out (EDO) and Synchronous DRAMs (SDRAMs) were developed to improve bandwidth. However, SDRAMs and EDO RAMs still do not match processor performance and, therefore, still limit system performance. Consequently, as faster microprocessors are developed for multimedia processing and high performance systems, faster memory architecture is being developed to bridge the memory/processor performance gap, e.g., wide I/O DRAMs.

Recent developments predict a major turning point for memory devices and related subsystems with a shift to high speed/narrow I/O devices. Although these new devices offer a significant increase in burst speeds, they do not offer improvements in latency for initial accesses. That is, for an initial access or page hit, it typically takes a number of clock cycles before the data read out from the DRAM appears at the DRAM chip pins.

Thus, there is a need for high bandwidth DRAM chips that have a decreased page-hit latency.

SUMMARY OF THE INVENTION

It is therefore an object of the present invention to provide a high speed/narrow I/O DRAM having decreased page-hit latency.

It is yet another object of the present invention to provide a high speed/narrow I/O DRAM where the latency time can be adjusted to accommodate various applications.

According to the present invention, each memory device includes several logical banks, each of which can be uniquely addressed. Each of these logical banks contains a unique memory array segment and associated page register, the latter serving as a temporary storage location during high-speed page hit operations. To reduce latency during an initial page hit, further array optimization is realized by segmenting each logical bank into two segments with one, smaller segment, comprising a faster random access memory (FRAM) than the larger of the two segments. For example, in a 16Mb array (64×256×1024), the first, smaller segment comprises a high speed 2Mb array(representing one-eighth of the total bank) and is optimized for very fast accesses. The high speed array (FRAM) is designed to contain the first 8 bits of every 64 bit burst (Byte 0, Byte 8, Byte 16, . . . ,) totaling 2M bits (8×256×1024). The second segment, representing the remaining 14Mb array (56×256×1024), is implemented in a traditional manner with conventional DRAM.

Each FRAM reads to a high speed read register and writes to a high speed write register bypassing the normal internal bus protocol. The high speed read register is tied directly to a multiplexer and the high speed write register is tied directly to a demultiplexer connected to the chip I/O pins.

During a read access for the initial access of a selected page, the first or initial 8 bits of data from every group of 8 bytes (byte 0, 8, 16, . . . ) is transferred from the high-speed FRAM to the high speed read register, and immediately to the device pins via the multiplexer. While this initial data is read, subsequent accesses from the slower DRAMs have been initiated and the subsequent data bits from the remaining bytes (bytes 1–7, 9–15, . . . ) will continue to be strobed by the system clock. In this implementation, the high speed array/register structure permits the page access latency to be reduced.

Similarly, in a write operation the first 8 bits of data from every group of 8 bytes input at the chip pins, is transferred from the demultiplexer to the high speed write register and to the high-speed FRAM with the remaining bytes being stored in the DRAM.

Hence, by segmenting the array and page registers to permit the judicious use of high speed design techniques on only a small portion of the total memory results in a performance gain approaching what could be achieved by implementing the entire memory device with a high speed FRAM, but at much lower cost. In addition, this invention can be operated in a "conventional" or "reduced latency" mode thus permitting use by any application.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
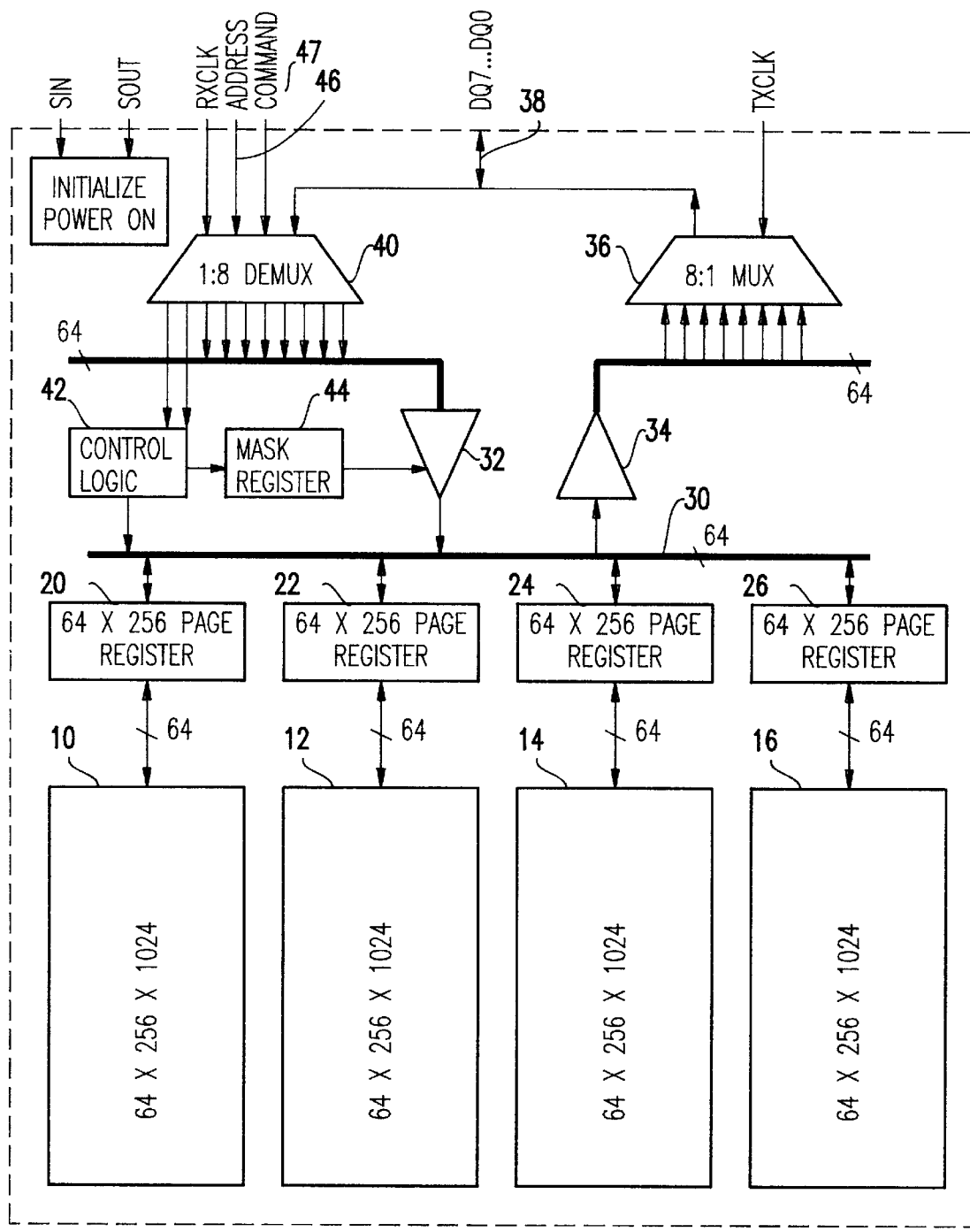
FIG. 1 is block diagram of a related high speed I/O DRAM memory page register device comprising addressable DRAM memory banks.

Referring now to the drawings, and more particularly to FIG. 1, there is shown a related high speed I/O DRAM memory device of the type sought to be improved by the present invention. A 16Mb memory array comprises four 4Mb (64×256×1024) sub-arrays 10, 12, 14, and 16. Each of the sub-arrays are buffered by a page register 20, 22, 24, and 26, respectively. The page registers are organized as 64×256 bit addresses (i.e., 2Kb). Data to and from the page registers 20, 22, 24, and 26 are transferred on a sixty-four bit bus 30 from driver 32 or buffer 34. Buffer 34 passes data from the sixty-four bit bus 30 to an 8:1 multiplexer (MUX) 36 and, in turn, the multiplexer 36 passes the data off chip to I/O pins 38 DQ0-DQ8. The sixty-four bit bus 30 permits eight bursts of eight bits. Similarly, data in from the I/O pins 38 are received by a 1:8 demultiplexer (DEMUX) 40 which, under the control of control logic 42 and data mask register 44, is passed by the driver 32 to the sixty-four bit-bus 30. In a page read operation, the first access row address and commands are piped into the control logic 42 via the I/O pins 38 DQ0-DQ8 in parallel. For a given address, it will require eight bursts of eight-bit bytes to read out the sixty-four bit wide page register. During this time, the next column address and commands are serially scanned into the address pin 46 and command 47 pin, one bit at a time for eight successive clock cycles, until a full page is read out. RXCLK and TXCLK are used for external handshaking. For the next page, a new packet is sent to the I/O pins 38 DQ0-DQ8 and the cycle starts over.

As is apparent, it may take several clock cycles for a data read from a sub-array 10, 12, 14, and 16 to initially appear at the output pins 38 since the data must first pass through a page register 20, 22, 24, or 26, through buffer 34, and the multiplexer 36 leading to an undesirably high latency period. The present invention therefore involves segmenting a portion of the data in a high speed FRAM and associated page resister and thereafter bypassing bus protocol such that data will appear at the output pins one clock cycle earlier.

Figure 2:
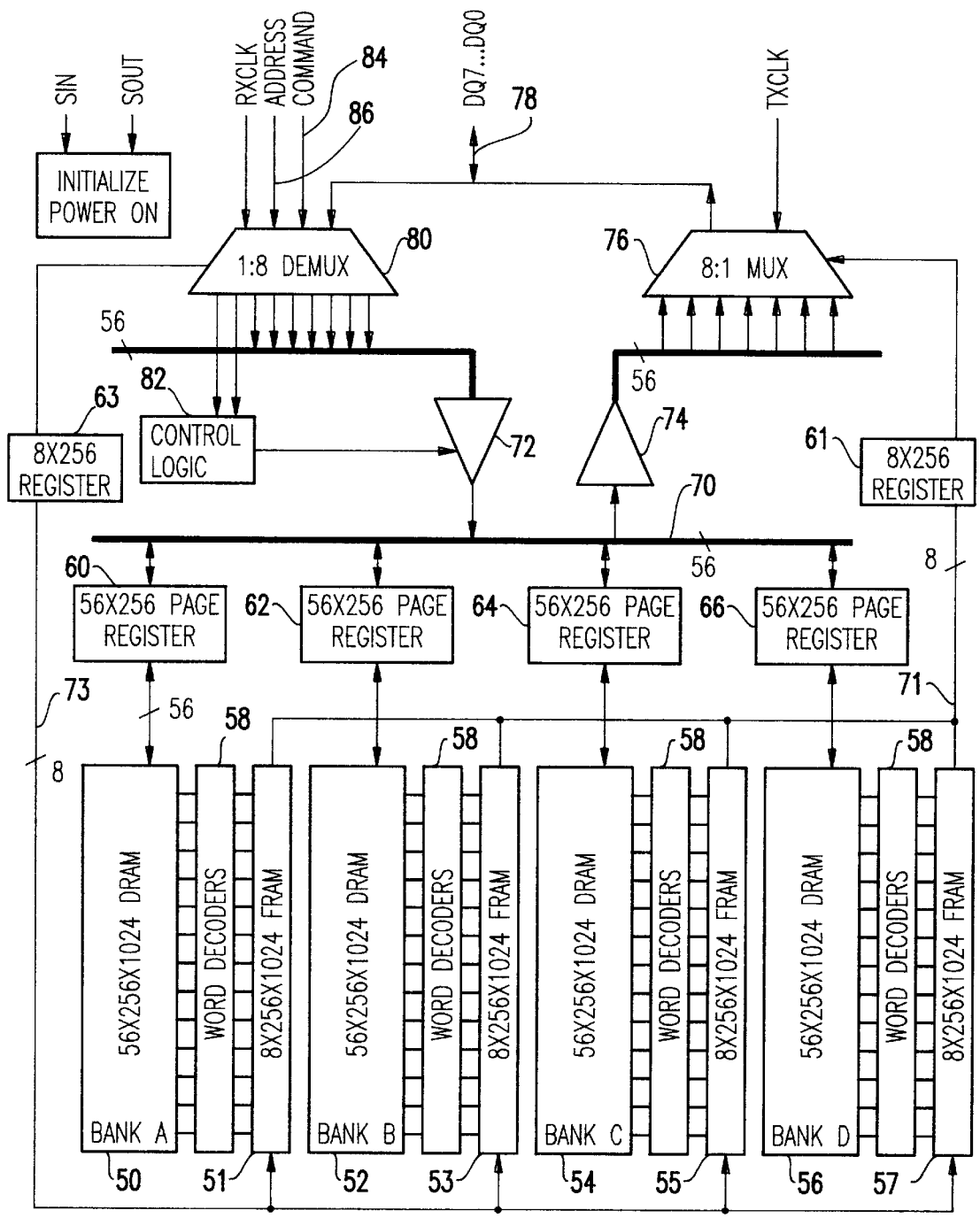
FIG. 2 is block diagram of a page register device according to the present invention for reduced page-hit latency.

Referring now to FIG. 2, there is shown a block diagram of a page register device according to the present invention for reduced page-hit latency. The page register device comprises several logical banks labeled A–D, each of which can be uniquely addressed and each of which comprise, for example, 14Mb. However, it is understood that although the present invention is described in terms of 14Mb memory banks, the organization and density are for example only and not intended to limit the invention to only those densities described.

Each of the logical banks A–D contains a unique memory array segment and associated page register, the latter serving as a temporary storage location during high-speed page hit operations. To reduce latency during page hit operations, further array optimization is realized by segmenting each logical bank A–D into two segments 50–51, 52–53, 54–55, and 56–57. The first, smaller segment, 51, 53, 55, and 57, comprises a fast random access memory (FRAM). For example, in a 16Mb array (64×256×1024), the first, smaller segment comprises a high speed 2Mb array (representing one-eighth of the total bank) and is optimized for very fast accesses. The high speed array (FRAM) is designed to contain the first 8 bits of every 64 bit burst (Byte 0, Byte 8, Byte 16, . . . ,) totaling 2M bits (8×256×1024). For example, the FRAM could be, but not limited to, a static RAM (SRAM) or a dual port RAM.

The second segment 50, 52, 54, and 56, representing the remaining 14Mb array (56×256×1024), is implemented in a traditional manner with conventional DRAM as described with reference to FIG. 1. That is, each second segment is buffered by a page register 60, 62, 64, and 66, respectively. The page registers are organized as 56×256 bit addresses (i.e., 14Kb). Data to and from the page registers 60, 62, 64, and 66 are transferred on a fifty-six bit bus 70 from driver 72 or buffer 74. Buffer 74 passes data from the fifty-six bit bus 70 to an 8:1 multiplexer (MUX) 76 and, in turn, the multiplexer 76 passes the data off chip to I/O pins 78 DQ0-DQ8. The fifty-six bit bus 70 permits seven bursts of eight bits.

Similarly, data in from the I/O pins 78 are received by a 1:8 demultiplexer (DEMUX) 80 which, under the control of control logic 82, is passed by the driver 72 to the fifty-six bit-bus 70. Register 63 performs a fast write to the FRAM. The control logic 82 controls the internal logic functions and the addressing of the RAM device. The next column address and commands are serially scanned into address pin 86 and command pin 84, one bit at a time for eight successive clock cycles until a full page is read out.

According to the invention, each FRAM 51, 53, 55, and 57 is connected to its corresponding DRAM 50, 52, 54, or 56 through a word decoder 58. The FRAM 51, 53, 55, and 57 reads to a high speed read register 61 and writes to a high speed write register 63 via eight-bit read bus 71 or write bus 73 bypassing normal internal bus protocol including the fifty-six bit bus 70 and either the driver 72 in a write operation, or the buffer 74 in a read operation. The high speed read register 61 is tied directly to the multiplexer 76 and the high speed write register 63 is tied directly to the demultiplexer 80 connected to the chip I/O pins 78.

In operation, during a read access for the first access of a selected page, the first or initial 8 bits of data from every group of 8 bytes (Byte 0, 8, 16, . . . ) is transferred from the high-speed FRAM 51, 53, 55, and 57 to the high speed read register 61, and immediately to the device pins 78 via the multiplexer 76. Latency is improved by the initial data since, while this initial data is read, subsequent accesses from the slower DRAMs 50, 52, 54, and 56 have been initiated and will continue to be strobed by the system clock to the I/O pins 78 following the initial data.

Similarly, in a write operation, the first or initial 8 bits of data from every group of 8 bytes (Byte 0, 8, 16, . . . ) initially presented at the I/O pins 78 immediately passes from the demultiplexer 80 through high speed write register 63 to be written into FRAMs 51, 53, 55, and 57 bypassing the normal bus protocol 70 including bypassing the driver 72 thus improving write performance.

A further advantage of the present invention is that it can be used in both lower latency applications as well as in 'industry standard' or conventional applications simply by adjusting the clocking of the high speed page registers 61 and 63. The lock mode can be selectable via the mode register 84. In a conventional mode, the clock speed of the high speed registers 61 and 63 can be attenuated such the memory page register device of the present invention can be slowed to emulate the speed of the circuit shown in FIG. 1 to accommodate those applications which are compatible with a longer latency.

While the invention has been described in terms of a single preferred embodiment, those skilled in the art will recognize that the invention can be practiced with modification within the spirit and scope of the appended claims.

We claim:

1. A random access memory (RAM) device, comprising:
   at least one memory bank comprising a first high speed memory portion and a second memory portion, said first high speed memory portion being faster than said second memory portion, said first high speed memory portion for storing initial data;
   at least one page register connecting said second memory portion to a bus protocol;
   multiplexer means for multiplexing read data output from said at least one memory bank and demultiplexing data to be written to said at least one memory bank; and
   at least one high speed page register connecting said first high speed memory portion to said multiplexing means, wherein the initial data is transferred between said first high speed memory portion and said multiplexer means bypassing said bus protocol.

2. A random access memory (RAM) device as recited in claim 1 comprising a plurality of memory banks.

3. A random access memory (RAM) device as recited in claim 1 wherein said at least one memory bank comprises a word decoder connecting said first high speed memory portion and said second memory portion.

4. A random access memory (RAM) device as recited in claim 1 wherein said multiplexing means comprises:
   a demultiplexer for demultiplexing data to be written to said at least one memory bank; and
   a multiplexer for multiplexing data read from said at least one memory bank.

5. A random access memory (RAM) device as recited in claim 4 wherein said bus protocol comprises:
   a bus for transferring data to and from said at least one page register;
   a buffer for buffering read data between said bus and said multiplexer; and
   a driver for driving write data from said demultiplexer to said bus.

6. A random access memory (RAM) device as recited in claim 1 further comprising means for controlling a speed of said at least one high speed page register.

7. A random access memory (RAM) device as recited in claim 1 wherein said first high speed memory portion comprises a faster random access memory and said second memory portion comprises a slower random access memory.

8. A random access memory (RAM) device as recited in claim 1 wherein said first high speed memory portion is smaller than said second memory portion.

9. A random access memory (RAM) device as recited in claim 1 wherein said first high speed memory portion comprises one of a static RAM (SRAM), a dual port RAM, or a flash RAM.

10. A random access memory (RAM) device, comprising:
    an plurality first RAM devices, each having a second, faster RAM device connected thereto for storing initial bits of data, said plurality of first RAM devices for storing subsequent bits of the data;
    means for multiplexing connected between data input/output ports and a bus protocol;
    a plurality of first page registers connected between said bus protocol and said plurality of first RAM devices; and
    a high speed page register connected between said second, faster RAM device and said means for multiplexing bypassing said bus protocol, wherein the initial data is transferred between said input/output ports and said second, faster RAM device with reduced latency.

11. A random access memory (RAM) device as recited in claim 10 wherein said high speed page register comprises a high speed read register and a high speed write register.

12. A random access memory (RAM) device as recited in claim 11 further comprising means for adjusting a speed of said high speed read register and a high speed write register to control latency for the initial data.

13. A random access memory (RAM) device as recited in claim 10 wherein said means for multiplexing comprises:
    a demultiplexer for demuliplexing data to be written to said RAM device; and
    a multiplexer for multiplexing data read from said RAM device.

14. A random access memory (RAM) device as recited in claim 10 wherein said bus protocol comprises:
    a bus for transferring data to and from said plurality of first page registers;
    a buffer for buffering read data between said bus and said multiplexer; and
    a driver for driving write data from said demultiplexer to said bus.

15. A random access memory (RAM) device as recited in claim 10 wherein said faster RAM device comprises one of a static RAM (SRAM), a dual port RAM, and a flash RAM.

16. A fast memory system, comprising:
    a random access memory (RAM) device divided into two segments wherein a first of said two segments is faster than a second of said two segments, said first, faster segment operating to process first data bits of each data burst.

17. A fast memory system as recited in claim 16 wherein said first, faster segment has a size one-eighth a size of said second segment and operates to process the first eight data bits of every sixty-four data bit burst.

* * * * *